(12) United States Patent
Khan (10) Patent No.: US 8,605,457 B2
(45) Date of Patent: Dec. 10, 2013

(54) ANTENNA FOR WIRELESS UTILITY METERS

(75) Inventor: Zafarullah Khan, Kenner, LA (US)

(73) Assignee: Itron, Inc., Liberty Lake, WA (US)

(*) Notice: Subject to any disclaimer, the term of this patent is extended or adjusted under 35 U.S.C. 154(b) by 413 days.

(21) Appl. No.: 12/978,095

(22) Filed: Dec. 23, 2010

(65) Prior Publication Data

US 2011/0149544 A1 Jun. 23, 2011

Related U.S. Application Data (60) Provisional application No. 61/289,791, filed on Dec. 23, 2009.

(51) Int. Cl.
*H05K 7/02* (2006.01)
*H05K 9/00* (2006.01)

(52) U.S. Cl.
USPC ........... 361/807; 361/800; 361/816; 361/667; 343/791; 343/795

(58) Field of Classification Search
USPC ............... 174/350–397; 361/800, 816
See application file for complete search history.

(56) References Cited

U.S. PATENT DOCUMENTS

| 5,432,303 | A  | * | 7/1995  | Turek et al. ............ 174/259 |
| 6,943,749 | B2 | * | 9/2005  | Paun ..................... 343/795 |
| 7,372,373 | B2 |   | 5/2008  | Borisov et al. |
| 7,459,986 | B2 |   | 12/2008 | Miller |
| 2006/0067070 | A1 | * | 3/2006 | Otsuki ................. 361/816 |
| 2009/0115677 | A1 | * | 5/2009 | Chung et al. ............ 343/791 |

* cited by examiner

*Primary Examiner* — Zachary M Pape
*Assistant Examiner* — Douglas Burtner
(74) *Attorney, Agent, or Firm* — Hanley, Flight & Zimmerman, LLC.

(57) ABSTRACT

An integrated antenna and electromagnetic (EM) noise shield apparatus for use with a radio frequency communicating device and EM noise generating electronic equipment housed within a generally cylindrical outer glass enclosure or bezel of wireless utility meter. A flexible printed circuit (PC) board has an upper region and a lower ground plane region. A radiating element is defined on the PC board in the upper region. A metal ground plane component has a first portion having the shape of a circle segment and a second orthogonal portion. The ground plane component is mechanically fixed and electrically connected to the ground plane region of the PC board, with the orthogonal second portion being proximate to and shielding the radiating element. The ground plane component and the ground plane portion of the PC board define an electromagnetic shield for electromagnetic emissions between EM noise generating electronic equipment housed within said outer bezel and the radiating element.

24 Claims, 8 Drawing Sheets

ANTENNA FOR WIRELESS UTILITY METERS

CROSS REFERENCE TO RELATED APPLICATION

This application claims the benefits of and priority to U.S. Provisional Patent Application No. 61/289,791, filed Dec. 23, 2010, which is incorporated herein by reference as if made a part hereof, under 35 U.S.C. §119(e).

BACKGROUND

Utility providers are using digital meters in order to gather qualitative and quantitative data regarding the services provided to consumers. Use of these meters is increasing in an effort to correlate charges and costs of the service provided to consumers.

These meters are in more and more use now-a-days owing to the fact that digital meters provide more accurate measurement and billing over the conventional meters. Further, digital meters allow service providers to track additional parameters, such as peak usage. These digital meters also facilitate constant monitoring and providing utility as per demand. Thus, use of digital meters has resulted in a cost effective solution on part of consumers and has also proved convenient to service providers allowing them to plan their resources better.

Earlier it was required to read the digital meters by direct visual observation by going on to the point of installation. To save manpower and time, the electric meter industry has developed wireless communication circuitry which can transmit and receive data signals over wireless networks. Signals are transmitted and received through an antenna. The antenna may be installed as an external or an internal component of the wireless utility meter.

An external antenna may be subjected to tampering. Further, functioning of external antenna may be affected by weather conditions also. Hence, an internal antenna ("under the glass") is favored for use with utility meters and technologies are known for manufacturing meters with built-in antennas. These antennas are typically placed inside the product enclosure and sealed for environmental and certification reasons.

It is known that the digital and power conversion circuits inside a utility meter radiate wideband noise that overlaps the receive band of the cellular modem or other radio receivers used for wireless data communications. This results in degraded total isotropic sensitivity (TIS) in the radio receiver that causes some meters to fall short of sensitivity standards required by CTIA, cellular carriers and other regulatory bodies. This problem exists for all "under the glass" utility meters because the antenna has to be within the outer cover of the utility meter and hence, always very close to the noise source.

Present products attempt to improve the TIS of antennas for wireless utility meters by adjusting the position of the antenna away from sources of noise or by installing radio frequency (RF) shielding cans or other noise reduction methods (such as spread spectrum oscillators or RF bypass capacitors).

U.S. Pat. No. 7,459,986 describes a method of reducing noise generated by the circuitry.

Another problem is the emission of secondary radiation at harmonic frequencies of the primary radiation. This secondary radiation is emitted by semiconductor devices present inside the utility meter when excited by primary radiation from the antenna. Because of the non-linear volt-ampere characteristics of semiconductor devices, this secondary radiation contains harmonics of the fundamental frequency being emitted by the antenna. This secondary radiation at harmonic frequencies causes utility meters to fail Radiated Spurious Emissions (RSE) standards mandated by PTCRB and other regulatory bodies.

U.S. Pat. No. 7,372,373 describes a method of reducing harmonic frequency radiation from a printed circuit board or a telemetry module.

Present products attempt to reduce RSE by using RF shields and RF bypass capacitors but the metrology and register boards inside utility meters are usually already in production so installing shields or RF bypass capacitors on them is not an option.

However, prior techniques of noise and radiation reduction suffer from a number of shortcomings. In, particular, the conventional systems and methods do not provide an effective method of noise and radiation reduction without contributing to the existing problem.

BRIEF SUMMARY OF THE INVENTION(S)

Briefly described, and according to one aspect, the present invention is an integrated antenna and electromagnetic (EM) noise shield apparatus for use with a radio frequency communicating device and EM noise generating electronic equipment housed within a generally cylindrical outer glass enclosure or bezel. Advantageously, the apparatus is suitable for use in a wirelessly communicating electric utility meter.

According to one aspect, the apparatus includes a flexible printed circuit (PC) board having an upper region and a lower region defining a ground plane. A radiating element is defined on the PC board in the upper region.

An arcuate metal ground plane component is provided for helping shield the radiating element. The metal ground plane component comprises a first portion having the shape of a segment of a circle and a second, preferably orthogonal portion. The metal ground plane component is mechanically fixed and electrically connected to the ground plane portion or region of the PC board, with the second (orthogonal) portion being proximate to and shielding the radiating element from noise sources positioned on the interior of the outer glass enclosure.

Advantageously, the metal ground plane component and the ground plane portion of the PC board define an electromagnetic shield for electromagnetic emissions between EM noise generating electronic equipment housed within the outer bezel and the radiating element.

According to one aspect, the PC board is a deformable PC board having generally the shape of a rectangle. In this aspect, the lower region is metal cladded and extends across the longer dimension of the rectangle defining the PC board.

According to another aspect, the radiating element comprises a dual band monopole radiating element defined in cladding on the PC board.

According to an aspect, the lower region of the PC board comprises conductive cladding forming a ground plane portion, with the ground plane portion having an elongate edge extending across the PC board and terminating to define an uncladded elongate boundary between an uncladded nonconductive second portion of the upper region of the PC board and the lower region of the PC board.

Preferably, the PC board is flexible and deformed into an arcuate shape for placement between the outer glass enclosure and the noise-sensitive and/or noise-generating electronic equipment. According to an aspect, the PC board includes a plurality of elongate slots defined therein, and the circle segment portion of the metal ground plane component includes a plurality of tongues that are inserted into the slots to hold the PC board in an arcuate configuration and electrically connect the ground plane component to conductive cladding on the lower region of the PC board forming a ground plane portion.

According to another aspect, an impedance conversion element is defined in the PC board. The impedance conversion element comprises a tuning stub.

According to another aspect, a frequency tuning element is defined in cladding on the PC board. According to yet another aspect, an impedance matching element is defined in cladding on the PC board.

Further still, an RF absorber sheet may be positioned adjacent to the ground plane portion on the lower region of the PC board.

The apparatus is particularly suitable for use in connection with electronic equipment in a utility metering device such as a wirelessly communicating electric meter. However, the apparatus is not solely limited for use in a wireless electric meter.

The invention is not limited to the preceding and it will be further understood by reference to the following detailed description and the appended drawings and claims.

These and other aspects, features, and benefits of the claimed invention(s) will become apparent from the following detailed written description of the preferred embodiments and aspects taken in conjunction with the following drawings, although variations and modifications thereto may be effected without departing from the spirit and scope of the novel concepts of the disclosure.

BRIEF DESCRIPTION OF THE DRAWING FIGURES

Many aspects of the invention can be better understood with reference to the following drawings. The components in the drawings are not necessarily to scale, emphasis instead being placed upon clearly illustrating the principles of the present invention. Moreover in the drawings like reference numerals designate corresponding parts throughout the several views.

FIG. 3, consisting of FIG. 3A through FIG. 3D, illustrates different views of the L-shaped metal shield that forms part of the antenna ground plane.

FIG. 4, consisting of FIG. 4A through FIG. 4C, illustrates the antenna printed circuit board (PCB) and connecting cable in the flattened configuration.

FIG. 5, consisting of FIG. 5A through FIG. 5C, illustrates steps of a method for manufacturing an antenna assembly in accordance with aspects of the invention, showing various configurations of the components during assembly.

DETAILED DESCRIPTION

Reference is now made in detail to the description of the embodiments of systems and methods for noise and spurious radiation reduction for an internal antenna of a wireless utility meter as illustrated in the drawings. The invention may, however be embodied in many different forms and should not be construed as limited to the embodiments set forth herein; rather, these embodiments are intended to convey the scope of the inventions to those skilled in the art. Furthermore, all "examples" or aspects given herein are intended to be non-limiting.

Figure 1:
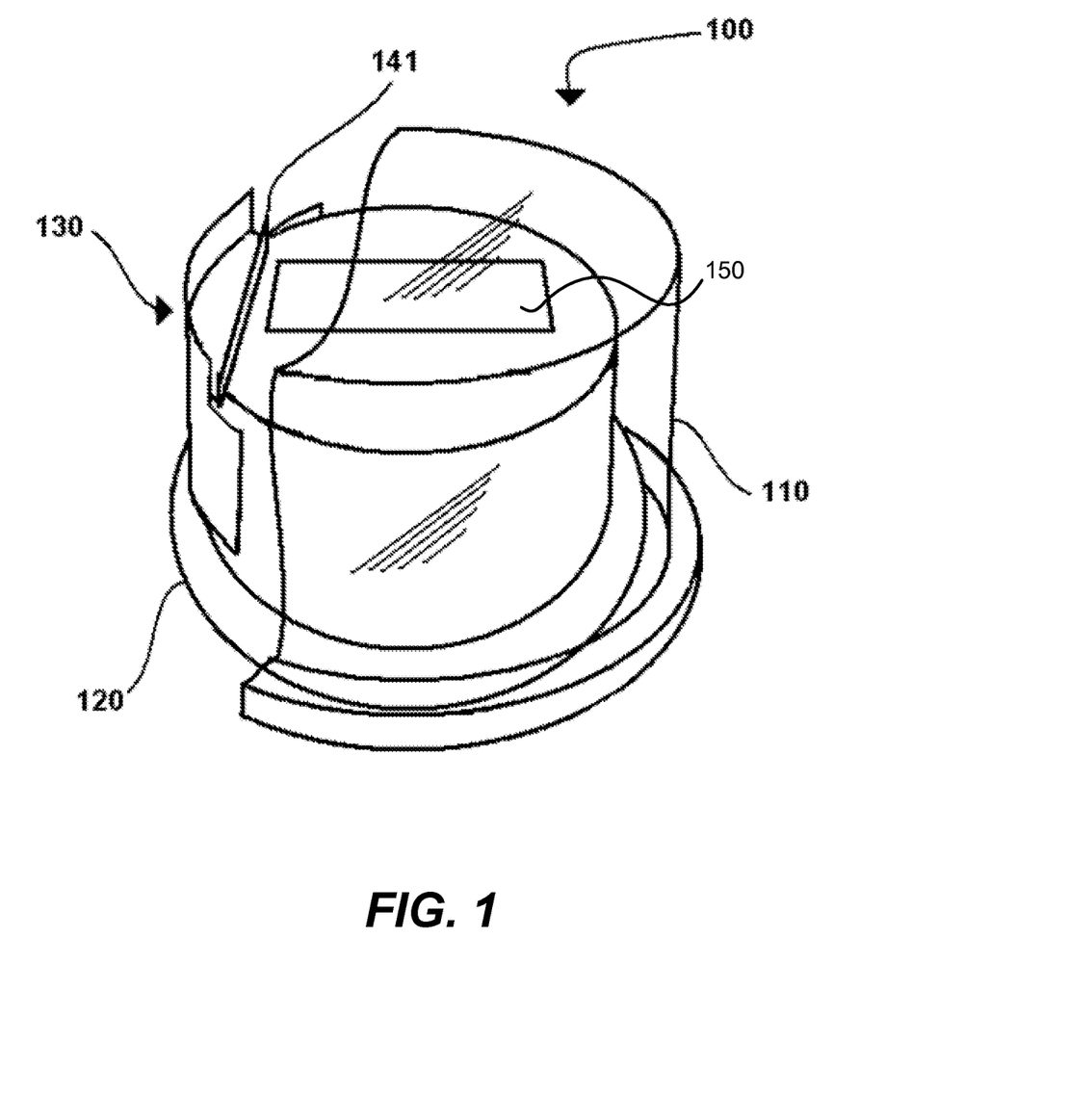
FIG. 1 illustrates an exemplary utility meter in accordance with aspects of the present invention, partially broken away to show an antenna assembly constructed as described herein.

Referring now to the drawings, in which like numerals indicate like elements throughout the several views, FIG. 1 illustrates a view of an exemplary utility meter 100 in accordance with aspects of the present invention. The utility meter 100 includes an outer bezel 110 (typically a transparent material such as glass) and an inner bezel 120. The utility meter 100 further includes an antenna assembly 130 which includes a metal shield 141 placed between the outer bezel 110 and inner bezel 120, and a PC board that contains metal cladding defining a ground plane and is etched to define radiating and tuning element(s) of the antenna, as will be described.

Figure 7:
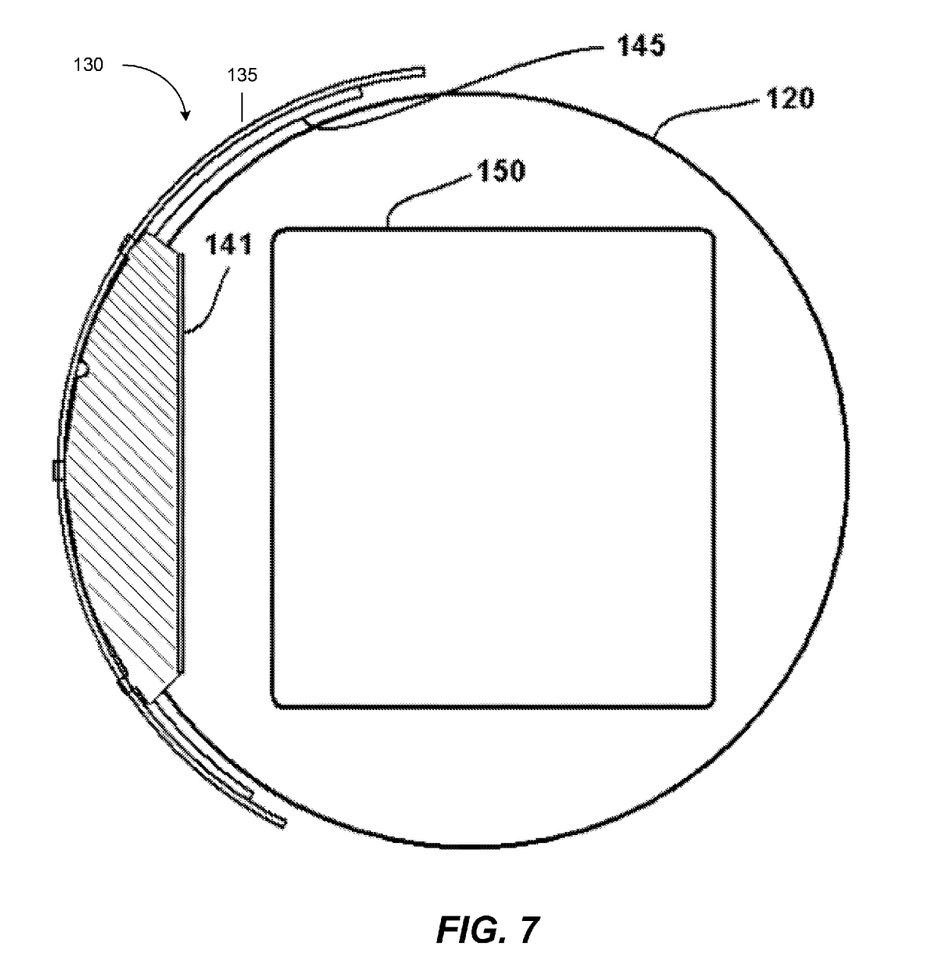
FIG. 7 is a top plan view of the completed antenna attached to the inner bezel of a meter.

The utility meter 100 also includes utility meter electronics 150 housed inside the inner bezel 120. These electronics are also shown in FIG. 7. The utility meter electronics 150 may include one or more telemetry modules and electronic circuits. These electronics 150 are typically the source of electromagnetic (EM) noise, and can also be adversely affected by signals radiating from the antenna assembly, unless shielded as described herein.

Figure 2:
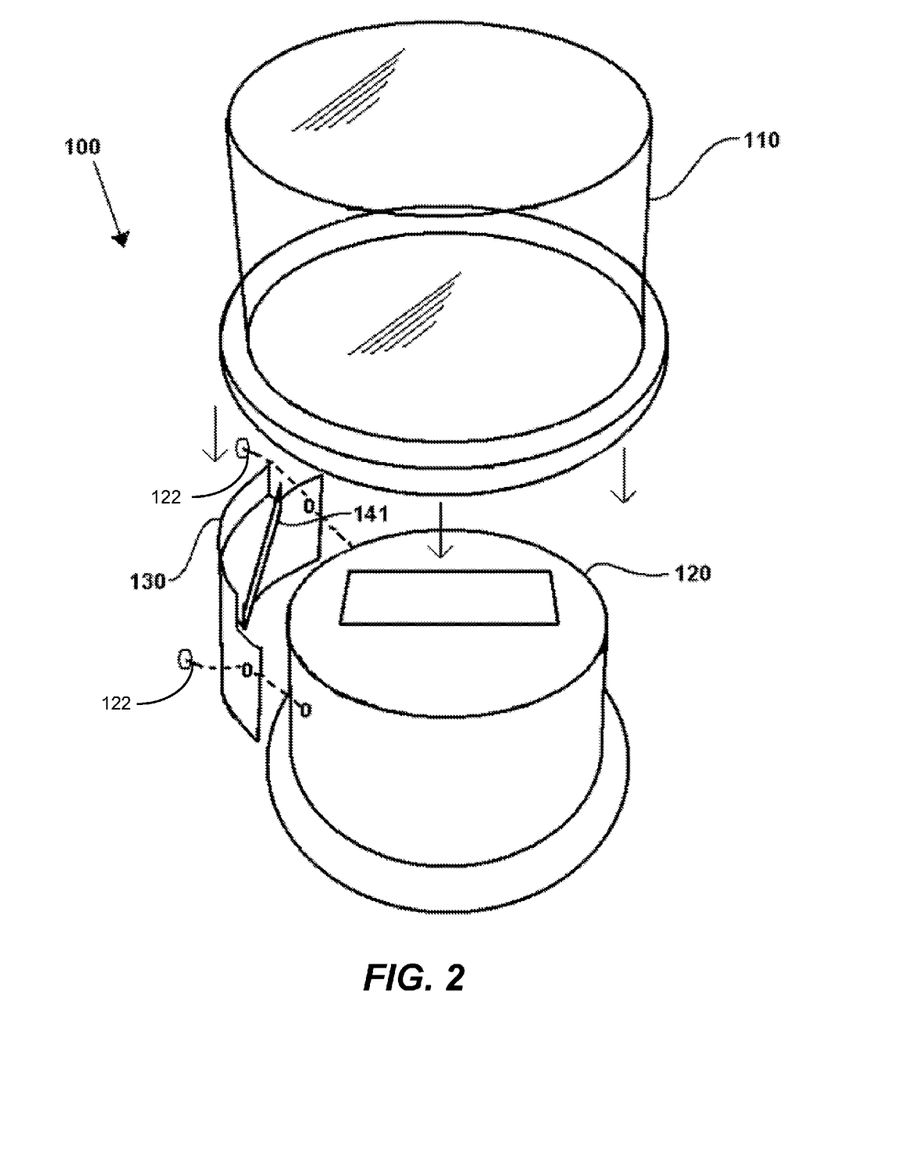
FIG. 2 illustrates an exploded view of the utility meter with the antenna assembly suspended in space, showing the outer bezel (outer cover) followed by the antenna assembly, followed by the inner bezel (inner cover) which contains the electronics.

FIG. 2 illustrates an exploded view of the meter 100 and shows how the antenna assembly 130 is mounted to the inner bezel 120 and the outer bezel 110 then encloses both the antenna assembly 130 and the inner bezel 120.

As can be seen in FIG. 2, the antenna assembly 130 comprises a curved or bent sheet-like structure, having the shape of the chord of circle when viewed from above. The assembly 130 is fastened to the inner bezel 120 by screws 122, pegs, or other type of fasteners that are inserted into corresponding mounting holes on the bezel 120. The curved or bent sheet-like structure, as will be shown and described, is a planar printed circuit (PC) board that includes cladding or metal-coated areas defining a ground plane for the antenna and also defining the radiating element(s) of the antenna, as well as tuning elements.

FIG. 3 illustrates an L-shaped metal shield 141 that is fastened to a flexible or bendable PC board (see FIG. 4) forming a ground plane, and holds the PC board in a curved or bent configuration. Preferably, the metal shield 141 is made of copper or other suitable electrically conductive material. The metal shield itself has the shape of a segment of a circle when viewed from above, with an L-shaped orthogonal portion extending across the chord line of the segment, as will be described.

Figure 3A:
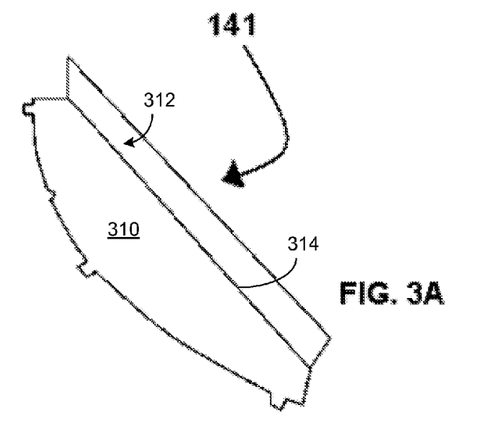

As seen in FIG. 3A in perspective view, the metal shield 141 comprises a first portion 310 having the shape of a segment of a circle, and a second or rectangular shield portion 312 extending orthogonally along the chord line 314 of the circle segment. As seen in FIG. 3C, the shield 141 has an L-shaped cross section.

Figure 3B:
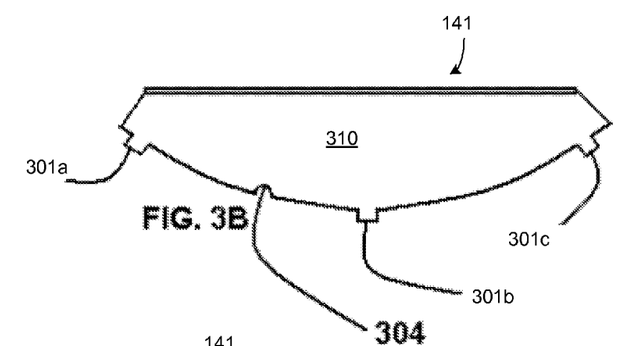
Figure 3C:
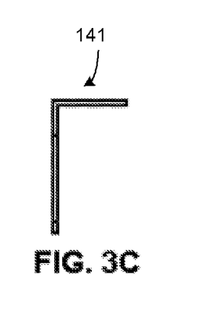
Figure 3D:
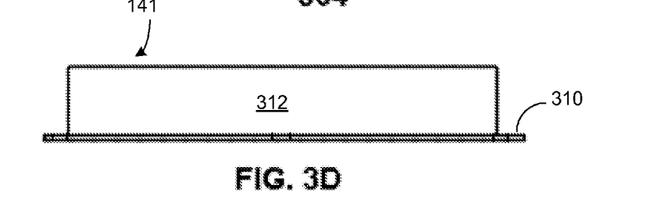

As seen in FIG. 3B, the first or circle segment portion 310 includes a plurality of spaced-apart tongues 310a, 310b, 310c that are inserted into corresponding slots or grooves in the PC board (see FIG. 4) ground plane. These tongues 310 are bent after insertion into contact with cladding on the PC board and soldered, so as to provide mechanical affixation and electrical continuity of the ground plane of the shield 141 and ground plane cladding on the PC board.

The first circle or segment portion 310 also includes a semi-circular slot or opening that allows a coaxial cable to pass through the metal shield so that the outer conductor (ground) of the coaxial cable can be electrically connected to the ground plane, but the inner signal-carrying conductor can be connected to a radiating element on the PC board. This is shown in more detail in FIG. 4.

Figure 6:
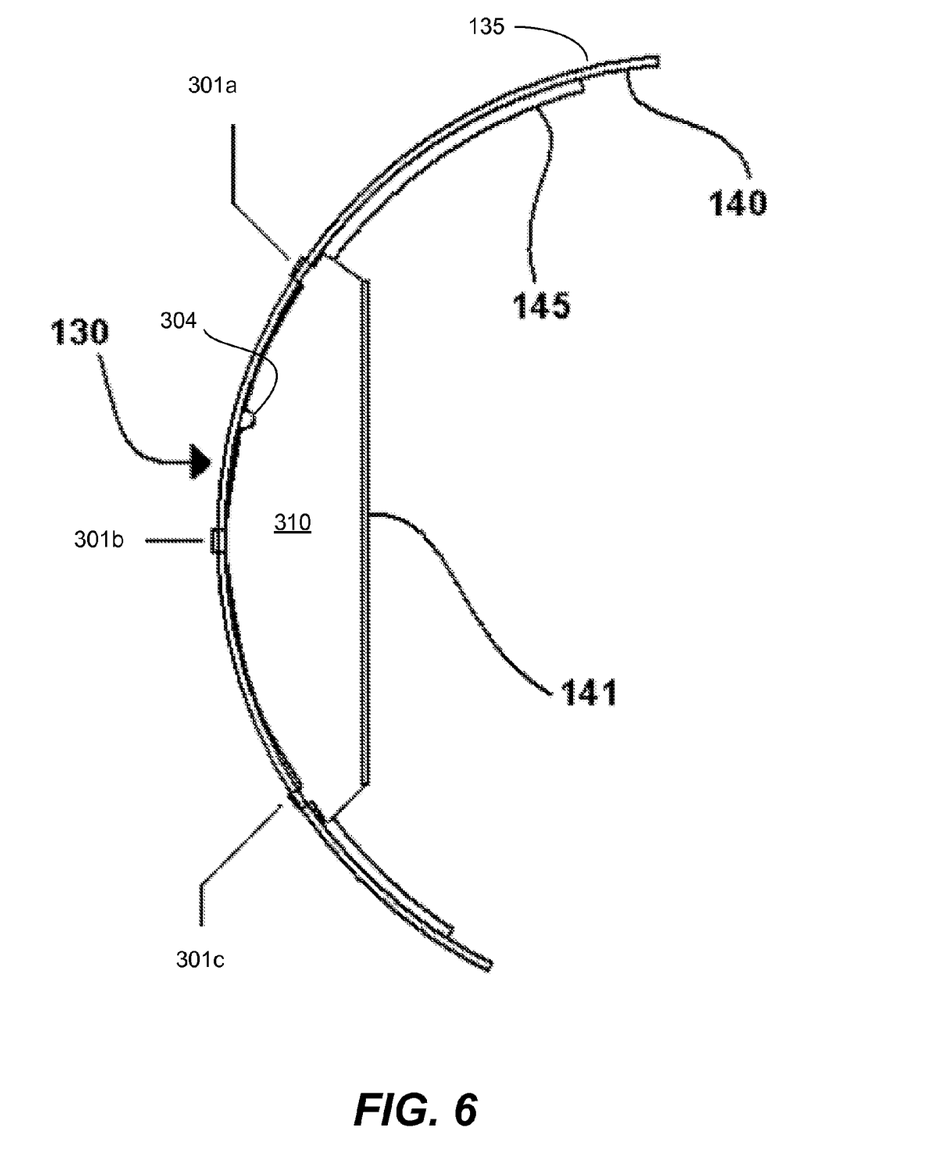
FIG. 6 is a top plan view of a completed antenna assembly.

Turning now briefly to FIG. 6, it can be seen here how the metal shield 141 is electrically connected to an antenna ground plane 140 of a PC board 135 by soldering the tongues 310a, 301b, and 301c of the metal shield 141 into slots (not shown in FIG. 6) in the curved PC board provided for this purpose in a metalized region of the PC board 135 defining antenna ground plane 140.

Figure 4A:
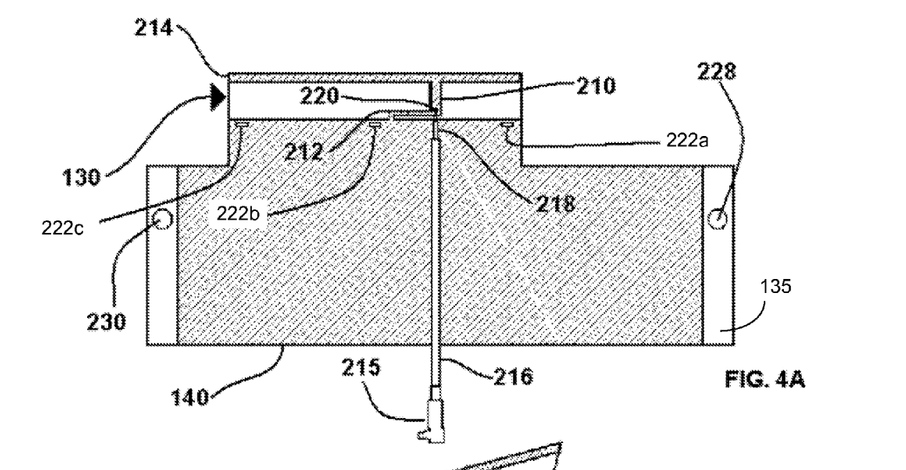
Figure 4B:
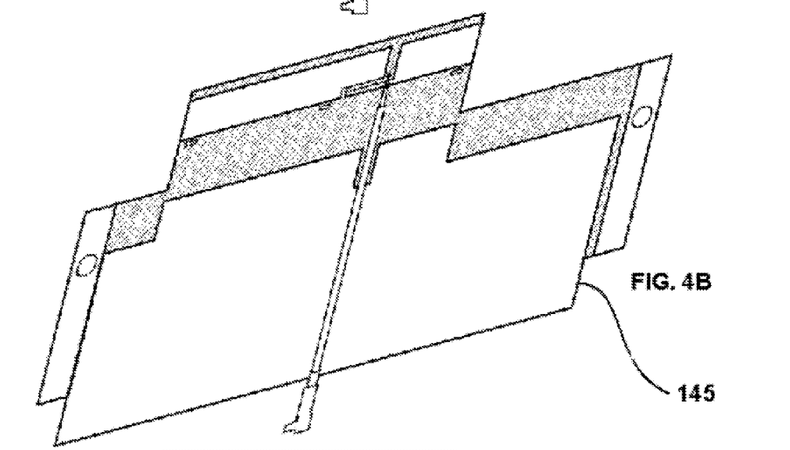
Figure 4C:
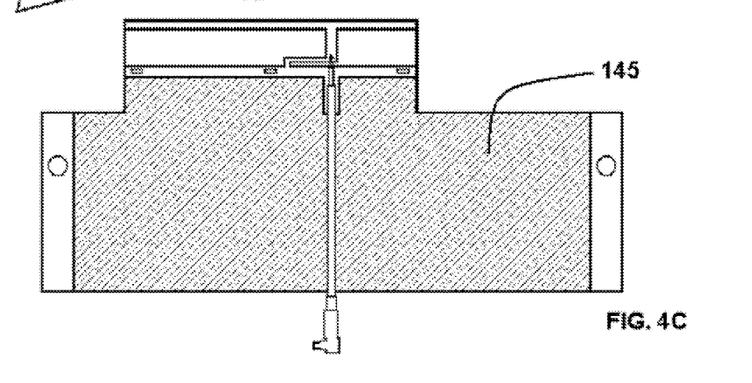

FIG. 4, consisting of several views of FIG. 4A through FIG. 4C, illustrates the antenna assembly 130 in its flat (unbent) configuration.

As seen in FIG. 4A, the antenna assembly 130 includes a main radiating element 210, a frequency tuning element 214, and an impedance conversion device 212. These elements are defined as metalized areas or regions on the PC board 135. The PC board 135 further comprises a metalized region 140 defining a ground plane for the antenna. Further, as can be seen from FIG. 4, the antenna assembly 130 is connected to the ground plane 140 through the impedance conversion device 212. Mounting holes 228, 230 are provided for attaching the antenna assembly to the inner bezel 120 with the help of plastic screws or rivets that pass through corresponding holes drilled into the inner bezel. Three slotted holes 222a, 222b, and 222c are provided for attaching the L-shaped metal shield 141. The tongues 301a, 301b, and 301c in the metal shield 141 fit into slotted holes 222a, 222b, and 222c, respectively and are soldered in place as shown in FIG. 6.

A coaxial cable 216 with MMCX right angle coaxial connector 215 is provided for connecting signals from and to the antenna radiating element to radio circuitry (not shown) 1. The coaxial cable shield outer sheath is removed at 218, so that the inner conductor of the cable can be soldered to the ground plane 140. The inner conductor 220 of the coaxial cable 216 is soldered to the radiating element 210.

FIG. 4B shows the insertion of a flexible ferrite RF absorber sheet 145 between the PC board 135 and the coaxial cable 216, where the sheet 145 is placed into contact with cladding on the PC board 145 defining the ground plane 140.

FIG. 4C shows the completed antenna assembly 130 including absorber sheet 145 in position.

Figures 5A, 5B:
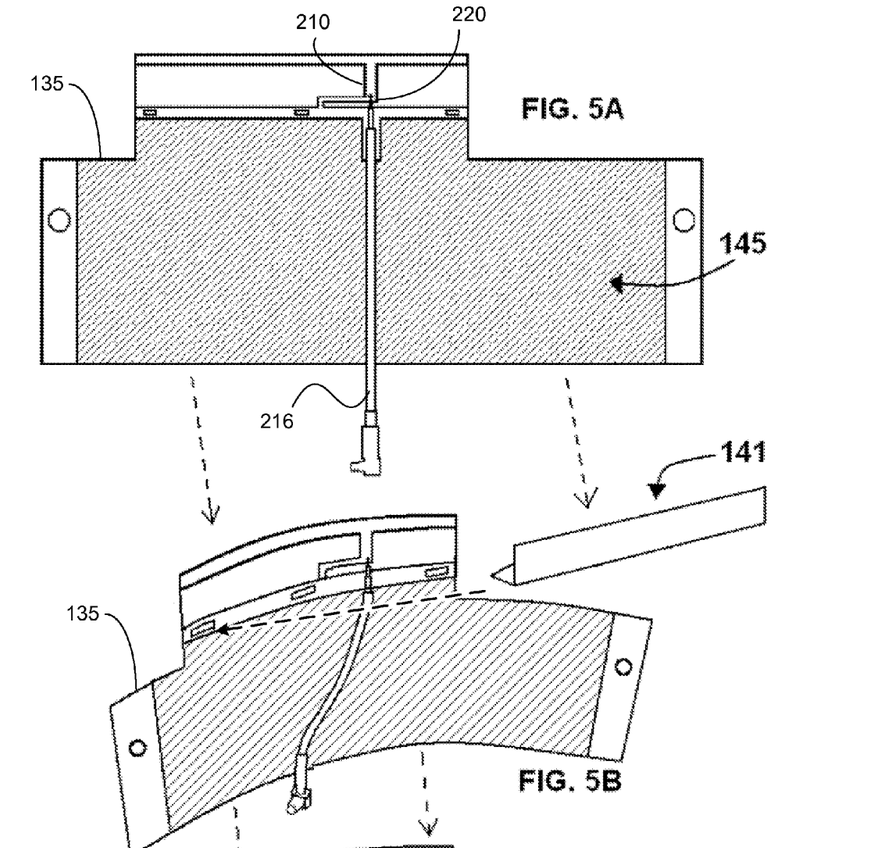

FIG. 5 illustrates how the PC board 135 is made into the antenna assembly. In FIG. 5A, the PC board in its flattened configuration is first affixed with the coaxial cable 216 that provides the signal to drive the antenna extending across the width of the PC board, and the inner conductor 220 soldered to the radiating element 210. The flexible ferrite RF absorber sheet 145 is positioned adjacent to the PC board to absorb RF radiation.

As shown in FIG. 5B, the PC board 135 is bent into an arcuate shape, and the tongues (not shown) of the L-shaped metal shield are inserted into the corresponding slots 222 in the PC board, bent over, and soldered to metal cladding on the PC board. The tongues physically hold the PC board in its bent configuration.

Figure 5C:
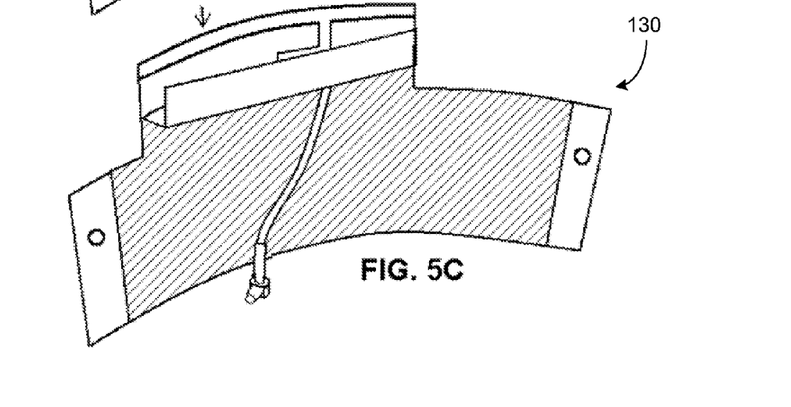

As shown in FIG. 5C, the completed antenna assembly 130 comprises an arcuate, segment of a circle shape when viewed from above.

FIG. 7 illustrates the completed antenna assembly 130 in a top plan view, mounted in position on the inner bezel 120. It will be understood that the RF absorber sheet 145 and the metal shield 141 are positioned in between the PC board 135 and the radiating elements of the antenna (which are not visible in this view) and the EM noise-generating and EM-sensitive electronics 150 within the bezel 120. Advantageously, the disclosed assembly thus provides an integrated, unitary antenna and RF emission shielding structure that allows two-way RF communications from the radiating element of the antenna, but shielding the antenna and its propagation pattern from EM noise generated by the electronics 150, but also shielding the electronics 150 from the RF radiation from the radiating elements.

Figure 8:
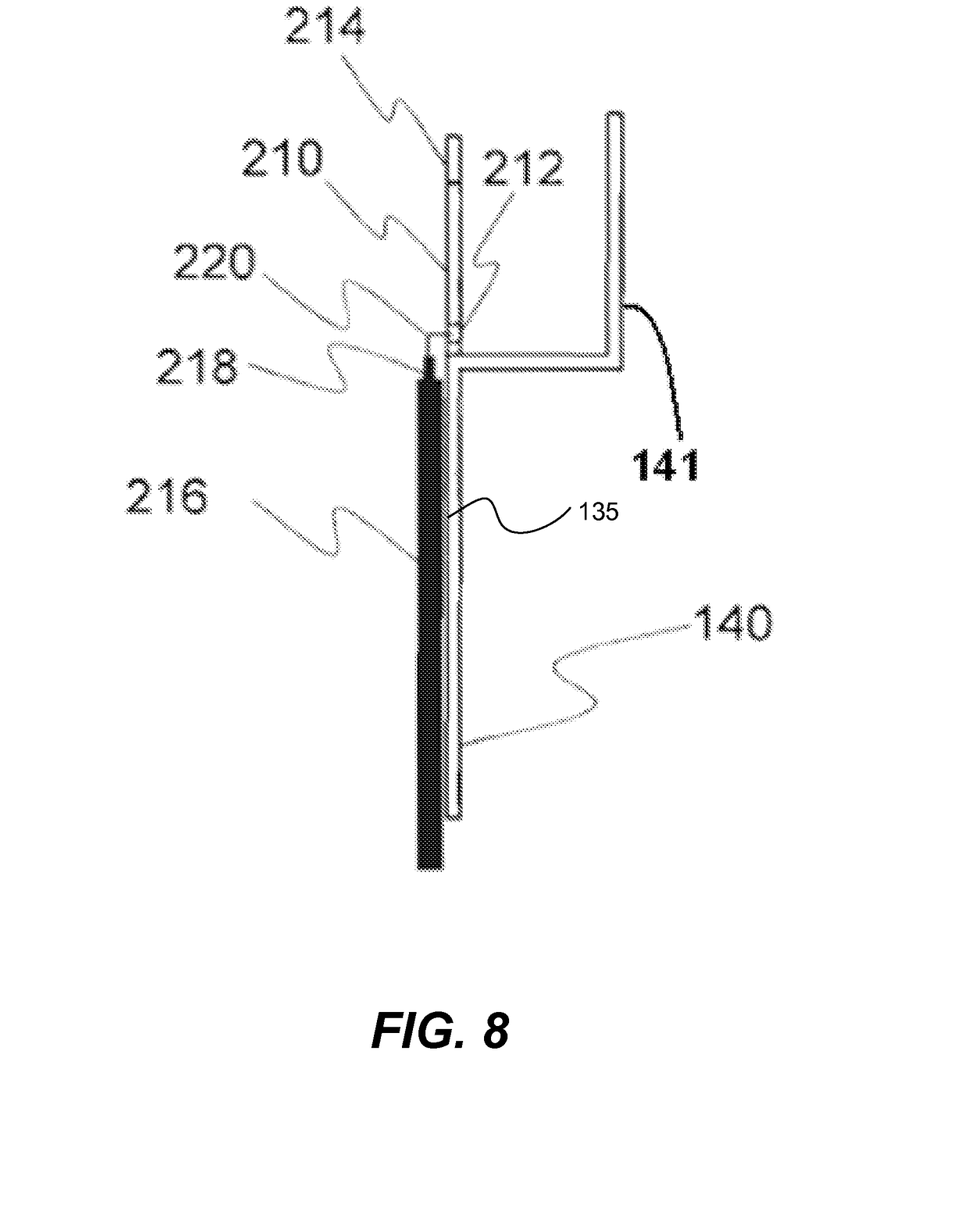
FIG. 8 is a cross-sectional view of the antenna assembly at the point where the cable shield enters the L-shaped metal shield.

FIG. 8 is a cross-sectional view of an alternative embodiment of the antenna assembly 130 wherein the coaxial cable 216 is run along the PC board 135 outside the PC board, rather than being fed through the semicircular opening 304 (not shown) in the metal shield 141. As in the other embodiment described herein, the inner conductor 220 of the coaxial cable 216 is soldered to the radiating element 210 of the antenna.

According to one aspect of the invention, the main radiating element 210 can be a dual band monopole radiating element. Further, as per this embodiment, the impedance conversion device 212 can be a tuning stub. Furthermore, as can be seen in the several figures, the dual band monopole radiating element 210 is electrically connected to the inner conductor 220 of the coaxial cable 216. The resonant frequency of the dual band monopole radiating element can be adjusted by adjusting the length of the frequency tuning element 214. The other end of the antenna ends in a MMCX coaxial connector 215.

As can be seen in FIG. 4 and FIG. 8, the ground plane 140 is electrically connected to the metal shield 141 and thus becomes a part of the ground plane that sits between the antenna assembly 130 and the utility meter electronics 150. This ground plane (formed by 140 and 141) reduces near field as well as far field coupling between the antenna 130 and the meter electronics 150. This coupling can be further reduced by adding the optional ferrite sheet 145 between the antenna ground plane 140 and inner bezel 120. The antenna 130 is therefore shielded from the noise emitted by the utility meter electronics 150. This improves the Total Isotropic Sensitivity (TIS) of the wireless telemetry module. The utility meter electronics 150 are shielded from the primary radiation emitted by the antenna 130. This reduces the amount of spurious radiation (RSE) emitted by the utility meter electronics 150.

The ground plane formed by 140 and 141 is electrically connected with the outer shield 218 at one end of the coaxial cable 216 and the antenna 130 is connected with the inner conductor 220 of the same end of coaxial cable 216. Furthermore, the other end of the coaxial cable 216 is connected to the utility meter electronics 150 via an MMCX coaxial connector 215. Further it is ensured that the desired signal travels back and forth between the utility meter electronics 150 and the antenna 130 with very little attenuation over the coaxial cable 216.

The degree of isolation between the antenna 130 and the noise producing utility meter electronics 150 inside the inner bezel 120 of the utility meter 100 is greatest when the ground plane 140 completely encloses the utility meter electronics 150 of the utility meter 100. If the ground plane 140 does not fully enclose the utility meter electronics 150, the degree of isolation is lower and falls further as the degree of encirclement is reduced. The addition of a flexible ferrite RF absorber sheet 145 between the antenna ground plane 140 and the inner bezel 120 that contains the utility meter electronics improves the isolation between the antenna 130 and the meter electronics 150 and thus makes it possible to achieve a given isolation with a smaller ground plane 140.

It will be understood and appreciated that the ground plane formed by 140 and 141 is not the same as a passive RF shield of the kind that is commonly used to shield electronic circuits but is part of the active radiating structure of the antenna. Due to this reason the antenna 130 can be made small enough to fit within the space that exists between the inner and outer bezels of the electric utility meter without compromising antenna radiation efficiency thus yielding an under-the-glass solution.

The foregoing description of the exemplary embodiments of the invention has been presented only for the purpose of illustration and description and is not intended to be exhaustive or to limit the invention to the precise forms disclosed. Many modifications and variations are possible in the light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope.

What is claimed is:

1. An integrated antenna and electromagnetic (EM) noise shield apparatus for use with a radio frequency communicating device and EM noise generating electronic equipment housed within a generally cylindrical outer glass enclosure or bezel, comprising:
   a printed circuit (PC) board having an upper region and a lower region defining a ground plane, wherein said PC board includes a plurality of elongate slots defined therein;
   a radiating element defined on the PC board in said upper region; and
   a metal ground plane component having a first portion having the shape of a segment of a circle and a second portion, said ground plane component being mechanically fixed and electrically connected to said ground plane portion of said PC board, said second portion being proximate to and shielding said radiating element from noise sources positioned on the interior of the outer glass enclosure, wherein the circle segment portion of said ground plane component includes a plurality of tongues that are inserted into said slots to hold the PC board in an arcuate configuration and electrically connect said ground plane component to conductive cladding on said lower region of the PC board forming a ground plane portion,
   whereby said ground plane component and said ground plane portion of said PC board defines an electromagnetic shield for electromagnetic emissions between said EM noise generating electronic equipment housed within said outer bezel and said radiating element.

2. The apparatus of claim 1, wherein said PC board is a deformable PC board having generally the shape of a rectangle.

3. The apparatus of claim 2, wherein said lower region is metal cladded and extends across the longer dimension of the rectangle defining said PC board.

4. The apparatus of claim 1, wherein said radiating element comprises a dual band monopole radiating element defined on said PC board.

5. The apparatus of claim 1, wherein the lower region of said PC board comprises conductive cladding forming a ground plane portion, said ground plane portion having an elongate edge extending across said PC board and terminating to define an uncladded elongate boundary between an uncladded nonconductive second portion of said upper region of said PC board and said lower region of said PC board.

6. The apparatus of claim 1, wherein the PC board is flexible and deformed into an arcuate shape for placement between said outer glass enclosure and said electronic equipment.

7. The apparatus of claim 1, further comprising an impedance conversion element defined in said PC board.

8. The apparatus of claim 7, wherein the impedance conversion element comprises a tuning stub.

9. The apparatus of claim 1, wherein the electronic equipment comprises a utility metering device.

10. The apparatus of claim 1, wherein the utility metering device is a wireless electric meter.

11. The apparatus of claim 1, further comprising a frequency tuning element formed in cladding on the PC board.

12. The apparatus of claim 1, further comprising an impedance matching element formed in cladding on the PC board.

13. The apparatus of claim 1, further comprising an RF absorber sheet positioned adjacent to said ground plane portion on said lower region of said PC board.

14. The apparatus of claim 1, wherein the electronic equipment comprises a utility metering device.

15. The apparatus of claim 1, wherein the utility metering device is a wireless electric meter.

16. The apparatus of claim 1, further comprising a frequency tuning element formed in cladding on the PC board.

17. The apparatus of claim 1, further comprising an impedance matching element formed in cladding on the PC board.

18. The apparatus of claim 1, further comprising an RF absorber sheet positioned adjacent to said ground plane portion on said lower region of the PC board.

19. The apparatus of claim 1, further comprising a slot formed on said metal ground plane portion for allowing a cable carrying signals to said radiating element to pass through said metal ground plane portion.

20. An integrated antenna and electromagnetic (EM) noise shield apparatus for use with a radio frequency communicating device and EM noise generating electronic equipment housed within a generally cylindrical outer glass enclosure or bezel, comprising:
   a deformable generally rectangular printed circuit (PC) board having an upper region and a lower region extending across the longer dimension of the rectangle of said PC board;
   conductive cladding on said upper region of said PC board defining a dual band monopole radiating element on said PC board;
   an uncladded nonconductive second portion of said upper region of said PC board;
   conductive cladding on said lower region of said PC board forming a ground plane portion, said ground plane portion having an elongate edge extending across the longer dimension of the rectangle of said PC board and terminating to define an uncladded elongate boundary between said uncladded nonconductive second portion of said upper region of said PC board and said lower region of said PC board;
   said PC board being deformed into an arcuate shape for placement between said outer glass enclosure and said electronic equipment;
   a metal ground plane component having a first portion having the shape of a segment of a circle and a second portion extending generally orthogonally from the chord edge of the circle segment; and
   said ground plane component being mechanically fixed and electrically connected along the arcuate edge of said first portion to said elongate edge of said ground plane portion of said PC board when said PC board is deformed into its arcuate shape, whereby said ground plane component and said ground plane portion of said PC board defines an electromagnetic shield for electromagnetic emissions between said EM noise generating electronic equipment housed within said outer bezel and said radiating element.

21. The apparatus of claim 20, further comprising an impedance conversion element.

22. The apparatus of claim 21, wherein the impedance conversion element comprises a tuning stub.

23. An integrated antenna and electromagnetic (EM) noise shield apparatus for use with a radio frequency communicating device and EM noise generating electronic equipment housed within a generally cylindrical outer glass enclosure or bezel, comprising:
  a printed circuit (PC) board having an upper region and a lower region defining a ground plane, wherein the PC board includes a plurality of elongate slots defined therein positioned proximate to said uncladded elongate boundary between said uncladded nonconductive second portion of said upper region of said PC board and said lower region of the PC board;
  a radiating element defined on the PC board in said upper region; and
  a metal ground plane component having a first portion having the shape of a segment of a circle and a second portion, said ground plane component being mechanically fixed and electrically connected to said ground plane portion of said PC board, said second portion being proximate to and shielding said radiating element from noise sources positioned on the interior of the outer glass enclosure, wherein the circle segment portion of said ground plane component includes a plurality of tongues that are inserted into said slots to hold the PC board in an arcuate configuration and electrically connect said ground plane component to conductive cladding on said lower region of the PC board forming a ground plane portion,
  whereby said ground plane component and said ground plane portion of said PC board defines an electromagnetic shield for electromagnetic emissions between said EM noise generating electronic equipment housed within said outer bezel and said radiating element.

24. A method of manufacturing an integrated antenna and electromagnetic (EM) noise shield for use by with a radio frequency communicating device and EM noise generating electronic equipment housed within a generally cylindrical outer glass enclosure or bezel, comprising the steps of:
  providing a deformable generally rectangular printed circuit (PC) board having an upper region and a lower region extending across the longer dimension of the rectangle of said PC board;
  providing conductive cladding on said upper region of said PC board defining a dual band monopole radiating element on said PC board;
  providing an uncladded nonconductive second portion of said upper region of said PC board;
  providing conductive cladding on said lower region of said PC board forming a ground plane portion, said ground plane portion having an elongate edge extending across the longer dimension of the rectangle of said PC board and terminating to define an uncladded elongate boundary between said uncladded nonconductive second portion of said upper region of said PC board and said lower region of said PC board;
  deforming said PC board into an arcuate shape for placement between said outer glass enclosure and said electronic equipment;
  affixing to said PC board a metal ground plane component having a first portion having the shape of a segment of a circle and a second portion extending generally orthogonally from the chord edge of the circle segment, said ground plane component being mechanically fixed and electrically connected along the arcuate edge of said first portion to said elongate edge of said ground plane portion of said PC board when said PC board is deformed into its arcuate shape,
  mounting the integrated antenna and electromagnetic (EM) noise shield on an inner bezel associated with the outer bezel such that the outer bezel covers the integrated antenna and EM noise shield,
  whereby said ground plane component and said ground plane portion of said PC board defines an electromagnetic shield for electromagnetic emissions between said EM noise generating electronic equipment housed within the outer bezel and the radiating element.

* * * * *